United States Patent
Lee et al.

(10) Patent No.: US 10,170,577 B1
(45) Date of Patent: Jan. 1, 2019

(54) VERTICAL TRANSPORT FETS HAVING A GRADIENT THRESHOLD VOLTAGE

(71) Applicant: International Business Machines Corporation, Armonk, NY (US)

(72) Inventors: Choonghyun Lee, Rensselaer, NY (US); Takashi Ando, Tuckahoe, NY (US); Jingyun Zhang, Albany, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/830,963

(22) Filed: Dec. 4, 2017

(51) Int. Cl.
| | |
|---|---|
| H01L 29/00 | (2006.01) |
| H01L 29/49 | (2006.01) |
| H01L 29/78 | (2006.01) |
| H01L 29/08 | (2006.01) |
| H01L 27/092 | (2006.01) |

(Continued)

(52) U.S. Cl.
CPC .... H01L 29/4983 (2013.01); H01L 21/28088 (2013.01); H01L 21/3215 (2013.01); H01L 21/823431 (2013.01); H01L 21/823814 (2013.01); H01L 21/823821 (2013.01); H01L 21/823842 (2013.01); H01L 21/823871 (2013.01); H01L 21/823885 (2013.01); H01L 21/845 (2013.01); H01L 23/535 (2013.01); H01L 27/0886 (2013.01); H01L 27/092 (2013.01); H01L 27/0924 (2013.01); H01L 27/1211 (2013.01); H01L 29/0847 (2013.01); H01L 29/4966 (2013.01); H01L 29/66795 (2013.01); H01L 29/785 (2013.01); H01L 29/7827 (2013.01)

(58) Field of Classification Search
CPC ............. H01L 29/66795; H01L 29/785; H01L 21/823431; H01L 21/823821; H01L 27/0886; H01L 27/0924; H01L 27/1211; H01L 21/845
See application file for complete search history.

(56) References Cited

U.S. PATENT DOCUMENTS

| | | | | |
|---|---|---|---|---|
| 8,686,514 B2 * | 4/2014 | Guo | ...................... | H01L 21/845 257/392 |
| 9,805,982 B1 * | 10/2017 | Zang | ............... | H01L 21/823456 |

(Continued)

OTHER PUBLICATIONS

Narasimhulu et al., "Impact of Lateral Asymmetric Channel Doping on Deep Submicrometer Mixed-Signal Device and Circuit Performance", IEEE Transactions on Electron Devices, Dec. 2003, pp. 2481-2489, vol. 50, No. 12.

(Continued)

*Primary Examiner* — Ngan Ngo
(74) *Attorney, Agent, or Firm* — Scully, Scott, Murphy & Presser, P.C.; L. Jeffrey Kelly, Esq.

(57) ABSTRACT

Vertical transport field effect transistors (FETs) having improved device performance are provided. Notably, vertical transport FETs having a gradient threshold voltage are provided. The gradient threshold voltage is provided by introducing a threshold voltage modifying dopant into a physically exposed portion of a metal gate layer composed of an n-type workfunction TiN. The threshold voltage modifying dopant changes the threshold voltage of the original metal gate layer.

8 Claims, 13 Drawing Sheets

(51) Int. Cl.
  *H01L 21/8238* (2006.01)
  *H01L 21/28* (2006.01)
  *H01L 21/3215* (2006.01)
  *H01L 23/535* (2006.01)
  *H01L 29/66* (2006.01)
  *H01L 21/8234* (2006.01)
  *H01L 21/84* (2006.01)
  *H01L 27/12* (2006.01)
  *H01L 27/088* (2006.01)

(56) References Cited

U.S. PATENT DOCUMENTS

| | | | | |
|---|---|---|---|---|
| 2011/0108920 | A1* | 5/2011 | Basker | H01L 21/845 257/351 |
| 2011/0291166 | A1* | 12/2011 | Booth, Jr. | H01L 21/823821 257/296 |
| 2013/0224945 | A1* | 8/2013 | Liu | H01L 29/66545 438/595 |
| 2014/0187013 | A1* | 7/2014 | Xu | H01L 29/66795 438/305 |
| 2016/0240444 | A1* | 8/2016 | Chao | H01L 22/20 |
| 2018/0145143 | A1* | 5/2018 | Chen | H01L 29/42368 |
| 2018/0151562 | A1* | 5/2018 | Kundu | H01L 29/785 |

OTHER PUBLICATIONS

Tai, et al., "Threshold Voltage Modulation Technique using Fluorine Treatment through Atomic Layer Deposition TiN Suitable for Complementary Metal-Oxide-Semiconductor Devices", Japanese Journal of Applied Physics, published online Apr. 25, 2008, pp. 2345-2348, vol. 47, No. 4.

Baek, et al., "Device Optimization of N-Channel MOSFETs with Lateral Asymmetric Channel Doping Profiles", Transactions on Electrical and Electronic Materials, Feb. 25, 2010, pp. 15-19, vol. 11, No. 1.

Wakabayashi, et al., "A Dual-Metal Gate CMOS Technology Using Nitrogen-Concentration-Controlled Tinx Film", IEEE Transactions on Electron Devices, Oct. 2001, pp. 2363-2369, vol. 48, No. 10.

* cited by examiner

VERTICAL TRANSPORT FETS HAVING A GRADIENT THRESHOLD VOLTAGE

BACKGROUND

The present application relates to a semiconductor structure and a method of forming the same. More particularly, the present application relates to a semiconductor structure including vertical transport field effect transistors having improved device performance as well as a method of forming such a structure.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for 5 nm and beyond.

The lateral asymmetric channel (LAC) doping profile approach provides one of the most effective ways to improve the electrical characteristics of transistor devices. For LAC devices, the doping concentration of the source side is higher than that of the drain side in the channel. The channel potential transition at the source side channel region is much stepper than that of the other channel regions, while the device is operating due to non-uniform channel doping. Such a steep potential distribution near the source side enhances the lateral channel electric field and this increases the carrier mobility. This approach, however, suffers from channel dopant diffusion and dopant variation. Also, it is difficult to design short channel devices using the LAC approach.

There is thus a need for providing vertical transport field effect transistors (FETs) having improved electrical characteristics and device performance.

SUMMARY

Vertical transport field effect transistors (FETs) having improved device performance are provided. Notably, vertical transport FETs having a gradient threshold voltage are provided. The gradient threshold voltage is provided by introducing a threshold voltage modifying dopant into a physically exposed portion of a metal gate layer composed of an n-type workfunction TiN. The threshold voltage modifying dopant changes the threshold voltage of the original metal gate layer.

One aspect of the present application relates to a semiconductor structure. In one embodiment the semiconductor structure includes at least one semiconductor fin present in a device region and extending upwards from a surface a base semiconductor substrate. A bottom source/drain structure is located on the base semiconductor substrate and contacts sidewall surfaces of a lower portion of the at least one semiconductor fin. The bottom source/drain structure serves as a drain region. A gate dielectric layer is located above the bottom source/drain structure and contacts another portion of the sidewall surfaces of the at least one semiconductor fin. A gate structure is located laterally adjacent a sidewall of the gate dielectric layer, the gate structure includes a TiN liner having a first threshold voltage and a TiN portion having a second threshold voltage that is greater than the first threshold voltage. A top source/drain structure is located on an upper portion of the at least one semiconductor fin and serving a source region.

In another embodiment, the semiconductor structure includes a vertical transport nFET and a laterally adjacent vertical transport pFET. In such a structure, the vertical transport nFET includes at least one semiconductor fin present in an nFET device region and extending upwards from a surface of a base semiconductor substrate. A bottom n-doped source/drain structure is located on the base semiconductor substrate and contacts sidewall surfaces of a lower portion of the at least one semiconductor fin, wherein the bottom n-doped source/drain structure serves as a drain region. A gate dielectric layer is located above the bottom n-doped source/drain structure and contacts another portion of the sidewall surfaces of the at least one semiconductor fin. An nFET gate structure is located laterally adjacent a sidewall of the gate dielectric layer, the nFET gate structure comprises a TiN liner having a first threshold voltage and a TiN portion having a second threshold voltage that is greater than the first threshold voltage. A top n-doped source/drain structure is located on an upper portion of the at least one semiconductor fin and serves as a source region.

The vertical transport pFET of such a structure includes at least one semiconductor fin present in a pFET device region and extending upwards from the surface of the base semiconductor substrate. A bottom p-doped source/drain structure is located on the base semiconductor substrate and contacts sidewall surfaces of a lower portion of the at least one semiconductor fin, wherein the bottom p-doped source/drain structure serves as a drain region. A gate dielectric layer is located above the bottom p-doped source/drain structure and contacting another portion of the sidewall surfaces of the at least one semiconductor fin. A pFET gate structure is located laterally adjacent a sidewall of the gate dielectric layer, the pFET gate structure comprising a TiN liner having the second threshold voltage and a TiN portion having a third threshold voltage that is greater than the second threshold voltage. A top p-doped source/drain structure is located on an upper portion of the at least one semiconductor fin and serves as a source region.

Another aspect of the present application relates to a method of forming a semiconductor structure. In one embodiment, the method may include providing at least one semiconductor fin extending upwards from a surface of a base semiconductor substrate and located in a device region, wherein the at least one semiconductor fin contains a hard mask cap thereon. A bottom source/drain structure is then formed on the base semiconductor substrate and contacting sidewall surfaces of a lower portion of the at least one semiconductor fin. Next, a gate dielectric material layer is formed above the bottom source/drain structure and contacting physically exposed portions of the at least one semiconductor fin and the hard mask cap. An n-workfucntion TiN layer having a first threshold voltage is formed on the gate dielectric material layer. A block mask is then formed over a lower portion of the n-workfucntion TiN layer. Next, physically exposed portions of the n-workfunction TiN layer are modified by incorporating a threshold voltage modifying dopant therein to provide a modified TiN layer having a second threshold voltage that is greater than the first threshold voltage. Next, the block mask is recessed to physically expose a portion, but not an entirety, of the modified TiN layer, and then the physically exposed portions of the modified TiN layer and the underlying gate dielectric material layer are removed to expose an upper portion of the at least one semiconductor fin. Next, the recessed block mask and the hard mask are removed, and thereafter a top source/drain structure is formed from physically exposed sidewall surfaces and a topmost surface of the at least one semiconductor fin.

DETAILED DESCRIPTION

Figure 1:
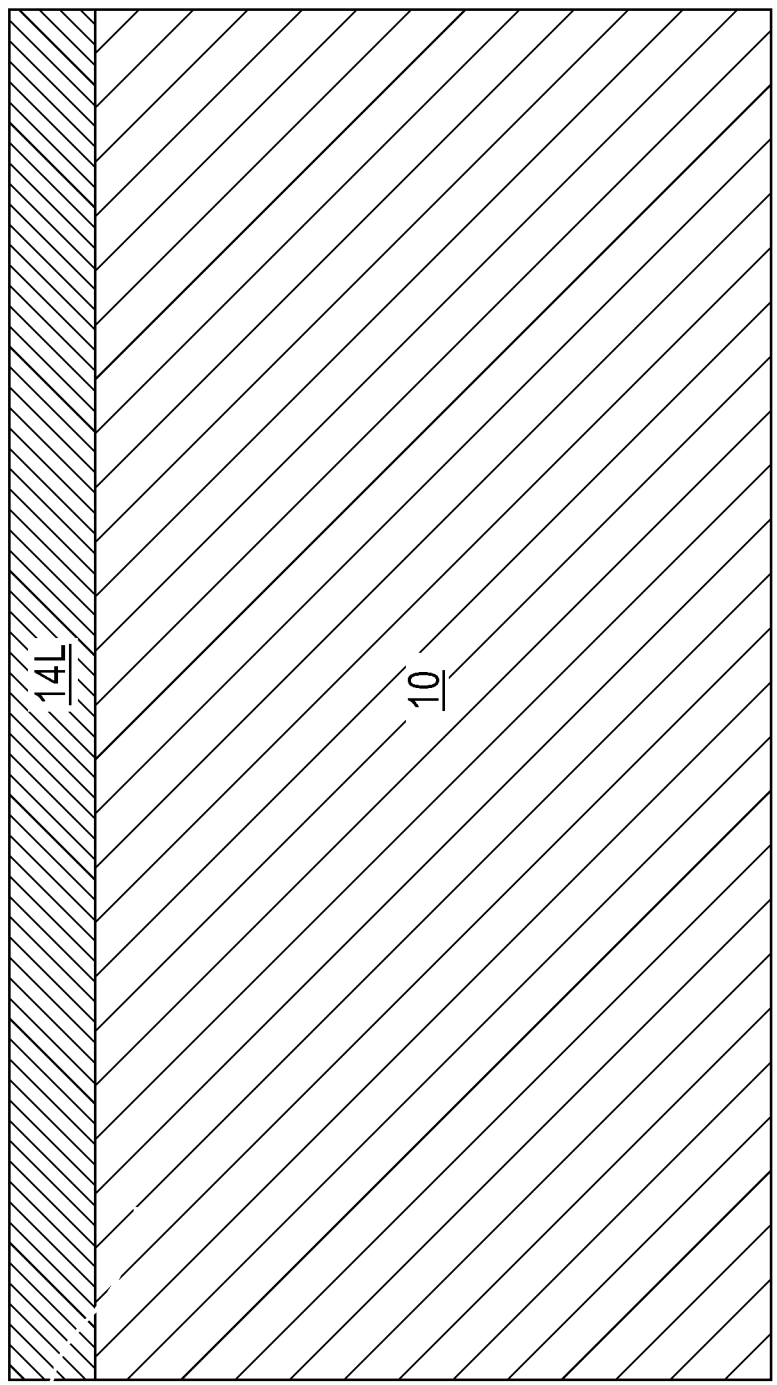
FIG. 1 is a cross sectional view of an exemplary semiconductor structure of the present application during an early stage of fabrication and including a hard mask layer located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication. The exemplary semiconductor structure of FIG. 1 includes a hard mask layer 14L located on a surface of a semiconductor substrate 10.

The semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The hard mask layer 14L that can be used in the present application includes any dielectric hard mask material such as, for example, silicon dioxide, silicon nitride and/or silicon oxynitride. In one example, silicon nitride is employed as the dielectric hard mask material. The hard mask layer 14L may be formed utilizing a deposition process such as, for example, chemical vapor deposition (CVD) or plasma enhanced chemical vapor deposition (PECVD). In some embodiments, the hard mask layer 14L may be formed by a thermal growth process such as, for example, thermal oxidation and/or thermal nitridation. In yet other embodiments, the hard mask layer 14L may be formed utilizing a combination of, and in any order, a deposition process and a thermal growth process. The hard mask layer 14L is a continuous layer (without any breaks or gaps) whose thickness may be from 20 nm to 100 nm. Other thicknesses that are lesser than, or greater than the aforementioned thicknesses values may also be employed as the thickness of the hard mask layer 14L.

Figure 2:
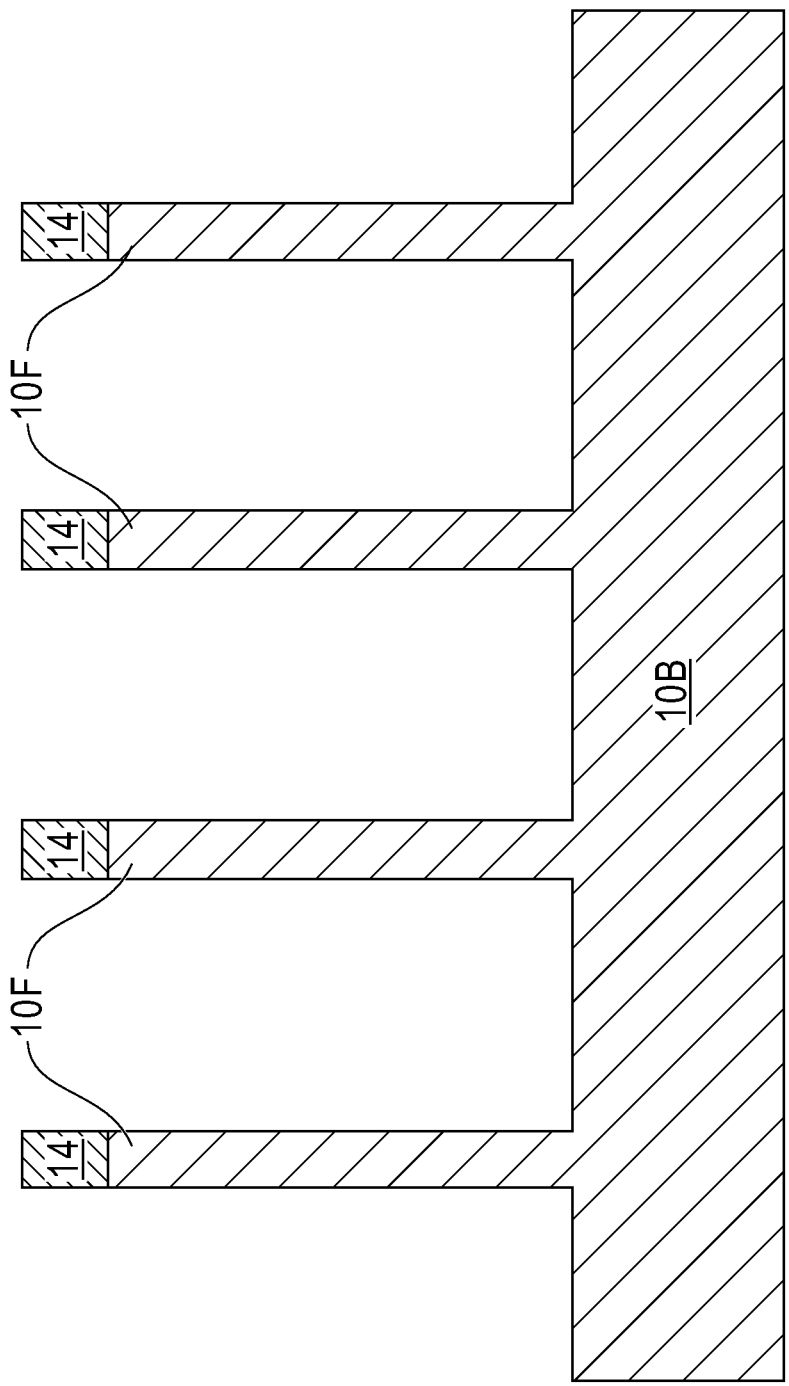
FIG. 2 is a cross sectional view of the exemplary semiconductor structure of FIG. 1 after patterning the hard mask layer and an upper semiconductor material portion of the semiconductor substrate to provide a plurality of hard mask capped semiconductor fins extending upwards from a surface of a remaining portion of the semiconductor substrate.

Referring now to FIG. 2, there is illustrated the exemplary semiconductor structure of FIG. 1 after patterning the hard mask layer 14L and an upper semiconductor material portion of the semiconductor substrate 10 to provide a plurality of hard mask capped semiconductor fins extending upwards from a surface of a remaining portion of the semiconductor substrate 10. Each hard mask cap 14 that is formed constitutes a remaining, non-etched portion of the hard mask layer 14L. Each semiconductor fin 10F constitutes a remaining, non-etched upper semiconductor portion of the semiconductor substrate 10 which is present directly beneath one of the hard mask caps 14. The remaining portion of the semiconductor substrate 10 that is located beneath each of the semiconductor fins 10F may be referred to herein as a base semiconductor substrate 10B.

In some embodiments, the semiconductor fins 10F and the base semiconductor substrate 10B may be composed of a same semiconductor material. In other embodiments, the semiconductor fins 10F and the base semiconductor substrate 10B may be composed of different semiconductor materials.

The number of hard mask capped semiconductor fins that are formed may vary and can be predetermined prior to forming the same. For example, it is possible to form a single hard mask capped semiconductor fin. As is shown, each semiconductor fin 10F contains a hard mask cap 14 whose sidewall surfaces are vertically aligned with the sidewall surfaces of one of the semiconductor fin 10F.

In one embodiment, the patterning of the hard mask layer 14L and the semiconductor substrate 10 may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., patterned transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer 14L. In other embodiments, the patterned photoresist is removed from the structure after the pattern has been transferred into both the hard mask layer 14L and the semiconductor substrate 10. In either embodiment, the patterned photoresist may be removed utilizing a conventional photoresist stripping process such as, for example, ashing.

In another embodiment, the patterning of the hard mask layer 14L and the semiconductor substrate 10 may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the hard mask layer 14L and the semiconductor substrate 10 may include a direct self-assembly (DSA) process in which a copolymer that is capable of direct self-assembly is used.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 10F has a height from 20 nm to 200 nm, and a width from 5 nm to 30 nm. Other heights and/or widths that are lesser than, or greater than, the ranges mentioned herein can also be used in the present application. Each semiconductor fin 10F is spaced apart from its nearest neighboring semiconductor fin 10F by a pitch of from 20 nm to 100 nm; the pitch is measured from one point of one semiconductor fin to the exact point on a neighboring semiconductor fin. Also, each semiconductor fin 10F is oriented parallel to each other. An opening or gap is present between each neighboring pairs of semiconductor fins 10F.

Figure 3:
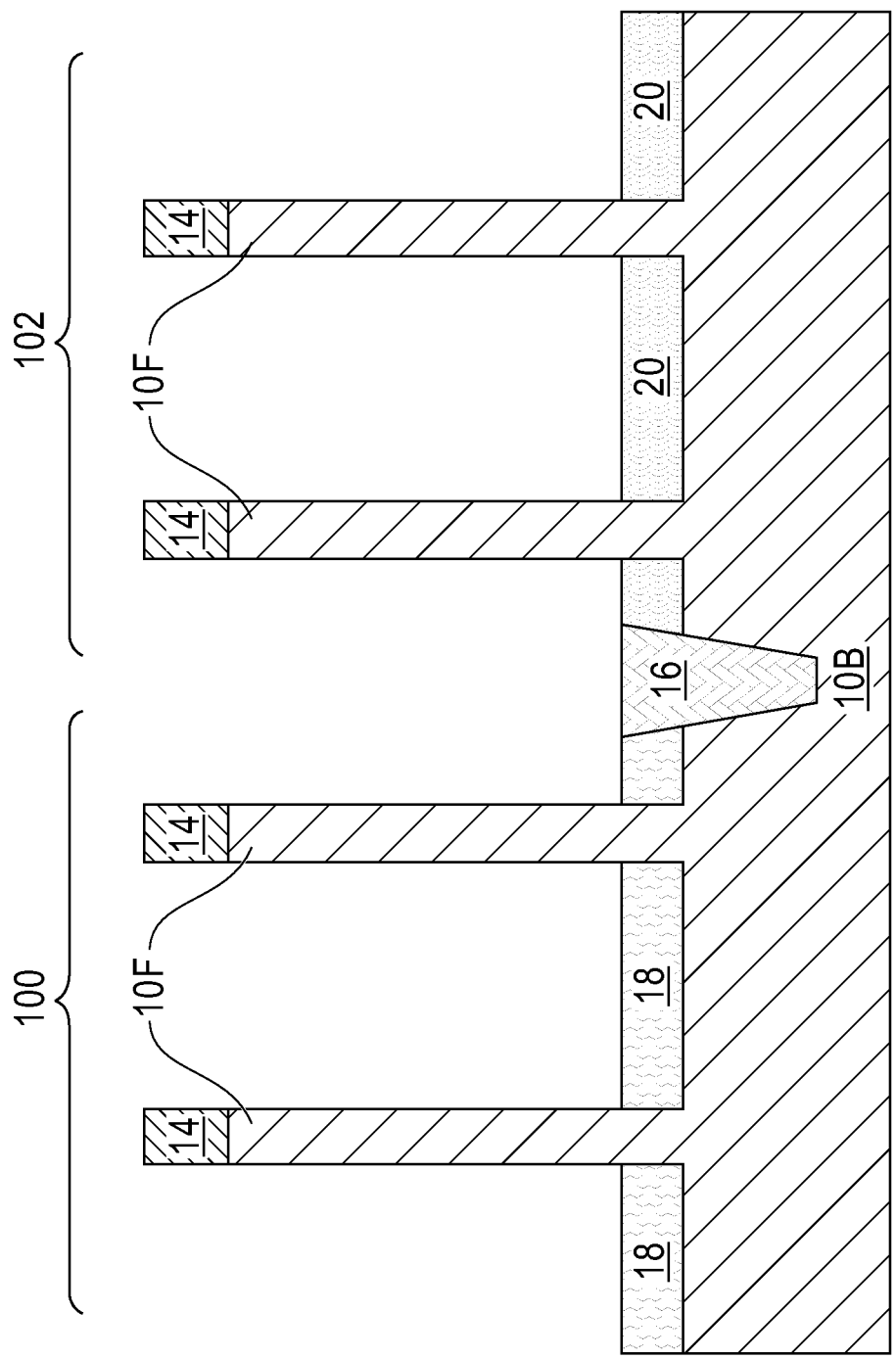
FIG. 3 is a cross sectional view of the exemplary semiconductor structure of FIG. 2 after forming a bottom n-doped source/drain structure in an nFET device and a bottom p-doped source/drain structure in a pFET device region, and forming an isolation structure between the different device regions.

Referring now to FIG. 3, there is illustrated the exemplary semiconductor structure of FIG. 2 after forming a bottom n-doped source/drain structure 18 in an nFET device 100 and a bottom p-doped source/drain structure 20 in a pFET device region 102, and forming an isolation structure 16 between the different device regions (100/102). In some embodiments, only a single device region, nFET device region 100 or pFET device region 102 can be formed.

The bottom n-doped source/drain structure 18 and the bottom p-doped source/drain structure 20 can be formed in any order. For example, and in one embodiment, the bottom n-doped source/drain structure 18 can be formed prior to the bottom p-doped source/drain structure 20. In such an embodiment, a block mask is formed in the pFET device region 102 and then the bottom n-doped source/drain structure 18 is formed by an epitaxial deposition or growth process. Following the epitaxial deposition or growth of the bottom n-doped source/drain structure 18, the block mask is removed from the pFET device region 102, another block mask is formed in the nFET device region 100 that now includes the bottom n-doped source/drain structure 18, and thereafter the bottom p-doped source/drain structure 20 is formed by another epitaxial deposition or growth process. Following epitaxial deposition or growth of the bottom p-doped source/drain structure 20, the another block mask is removed from the nFET device region 100. In embodiments in which the bottom p-doped source/drain structure 20 is formed prior to the bottom n-doped source/drain structure 18, the order of the above mentioned processing steps is reversed.

In the present application, the bottom n-doped source/drain structure 18 and the bottom p-doped source/drain structure 20 are used as drain regions of the resultant vertical transport FETs.

The bottom n-doped source/drain structure 18 includes a semiconductor material and an n-type dopant. The semiconductor material that provides the bottom nFET source/drain structure 18 may be the same as, or different from, the semiconductor material of semiconductor substrate 10. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom n-doped source/drain structure 18 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The bottom n-doped source/drain structure 18 has a height that is less than a height of each of the semiconductor fins 10F. The bottom n-doped source/drain structure 18 contacts sidewall surfaces of a bottom portion of the semiconductor fins 10F in the nFET device region 100.

The bottom p-doped source/drain structure 20 includes a semiconductor material and a p-type dopant. The semiconductor material that provides the bottom pFET source/drain structure 20 may be the same as, or different from, the semiconductor material of semiconductor substrate 10. Also, the semiconductor material that provides the bottom p-doped source/drain structure 20 may be the same as, or different from, the semiconductor material that provides the bottom p-doped source/drain structure 18. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom p-doped source/drain structure 20 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The bottom p-doped source/drain structure 20 has a height that is less than a height of each of the semiconductor fins 10F. The bottom pFET source/rain structure 20 contacts sidewall surface of a bottom portion of the semiconductor fins 10F in the pFET device region 102. The bottom pFET source/rain structure 20 may have a topmost surface that is coplanar with a topmost surface of the bottom n-doped source/drain structure 18.

The bottom source/drain structures (18/20) can be formed utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the bottom source/drain structures (18/20) have an epitaxial relationship with the physically exposed surface of the base semiconductor substrate 10B and the sidewalls of each semiconductor fin 10F.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture.

In some embodiments, isolation structure 16 can be formed between the different device regions (100/102). The isolation structure 16 can be formed by forming a trench opening in an area in which sidewalls of the bottom source/ drain structures (18/20) are in contact with each other, and then filling the trench opening with a trench dielectric material such as, for example, silicon dioxide. A recess etch may follow the trench filling step. Although the present application describes forming the isolation structure 16 after forming the bottom source/drain structures (18/20), the isolation structure 16 may be formed prior to forming the bottom source/drain structures (18/20).

Figure 4:
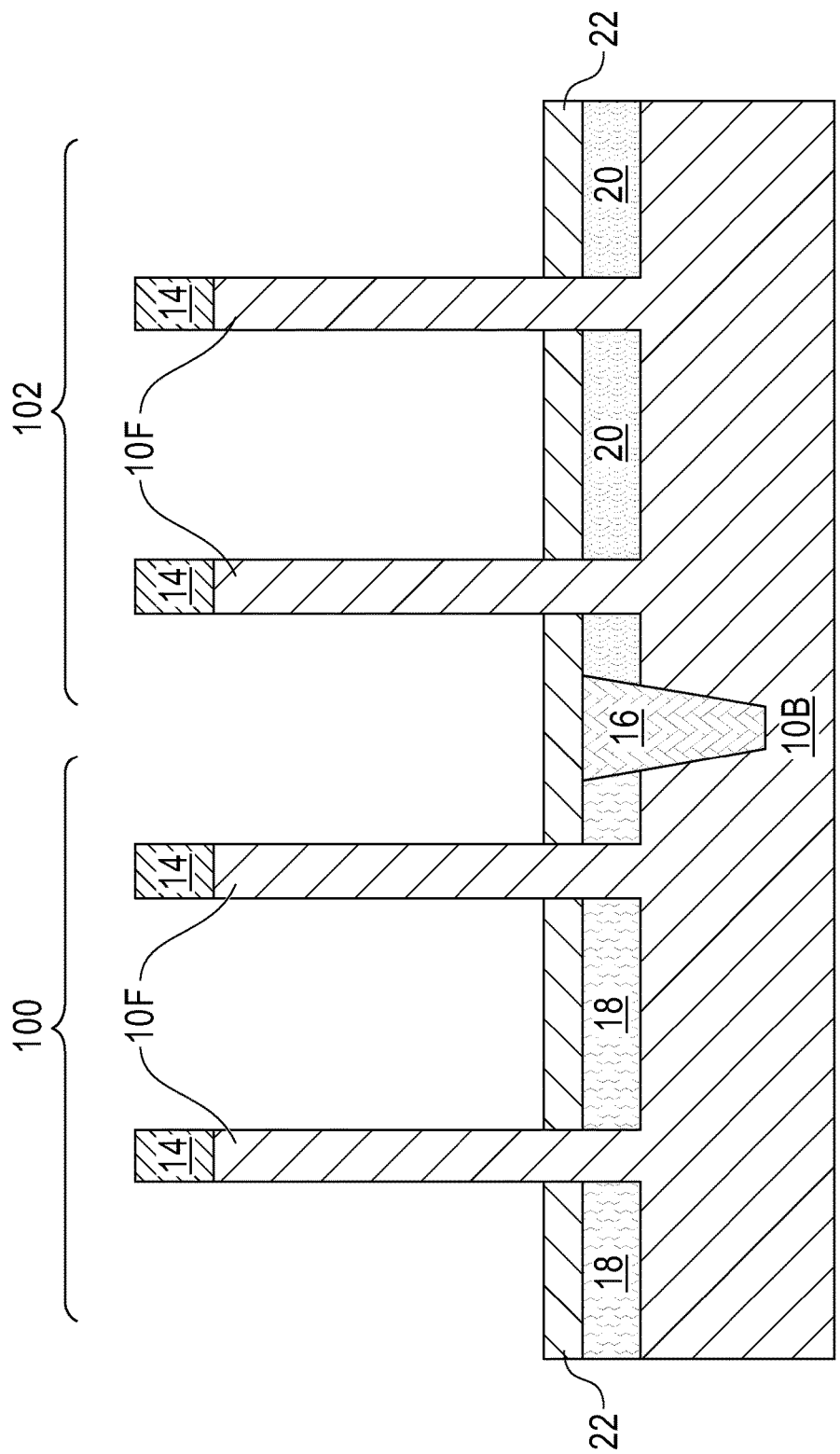
FIG. 4 is a cross sectional view of the exemplary semiconductor structure of FIG. 3 after forming a bottom spacer on a physically exposed surface of the bottom source/drain structures in each of the device regions.

Referring now to FIG. 4, there is illustrated the exemplary semiconductor structure of FIG. 3 after forming a bottom spacer 22 on a physically exposed surface of the bottom source/drain structures (18/20) in each of the device regions (100/102).

The bottom spacer 22 contacts sidewall surfaces of the lower portion of the semiconductor fins 10F present in each of the device regions (100/102). The bottom spacer 22 may be composed of any dielectric spacer material including for example, silicon dioxide, silicon nitride or silicon oxynitride. The bottom spacer 22 may be formed utilizing a deposition process such as, for example, chemical vapor deposition or plasma enhanced chemical vapor deposition. In some instances, an etch back process may follow the deposition of the dielectric spacer material that provides the bottom spacer 22. The bottom spacer 22 may have a thickness from 4 nm to 10 nm. Other thicknesses that are lesser than, or greater than, the aforementioned thickness range may also be employed in the present application as the thickness of the bottom spacer 22 as long as the height of the bottom spacer 22 is not greater than the height of the semiconductor fins 10F and there is sufficient area on each the semiconductor fins 10F to form other components of a vertical transport FET.

Figure 5:
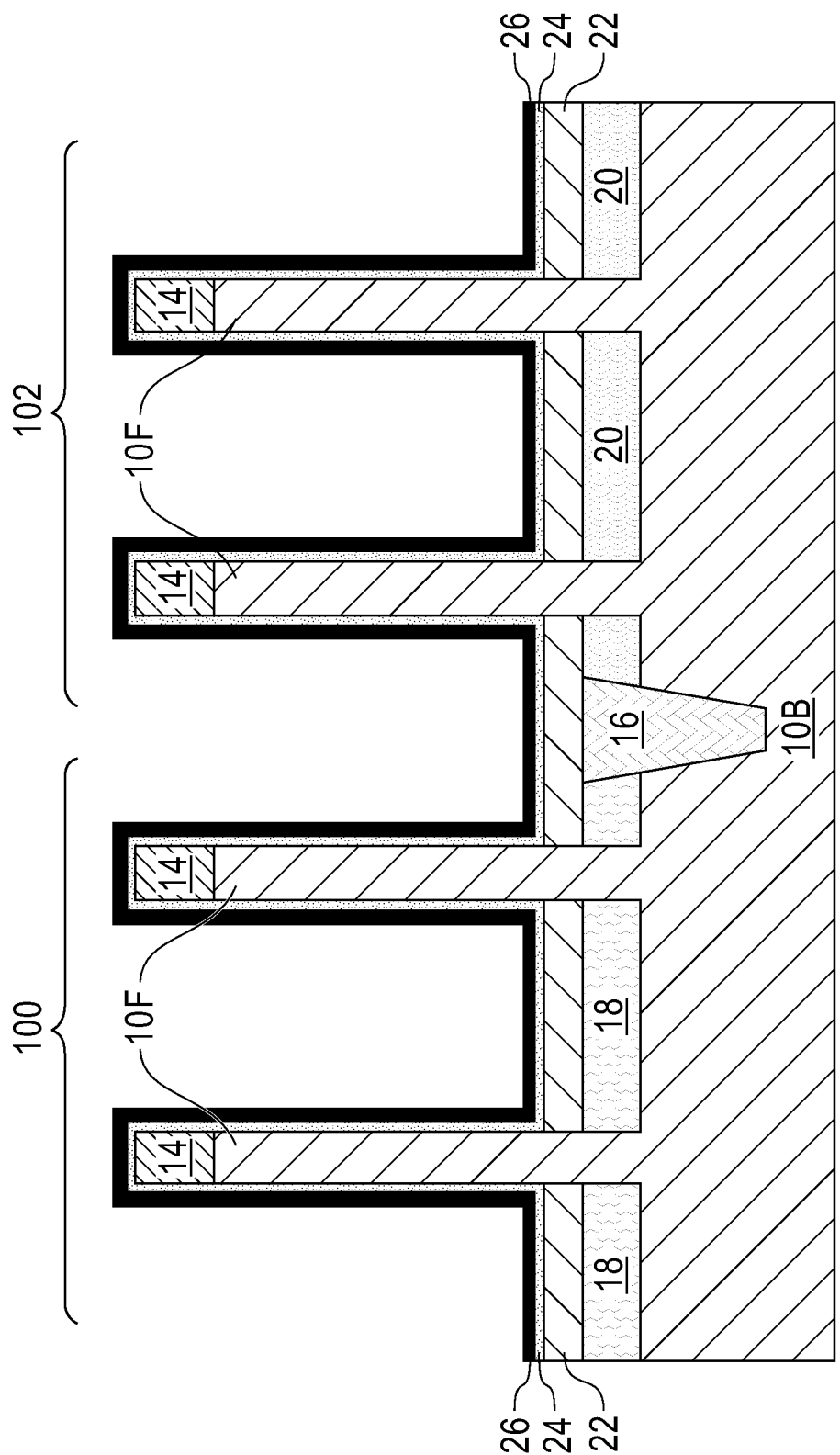
FIG. 5 is a cross sectional view of the exemplary semiconductor structure of FIG. 4 after forming a gate dielectric material layer and an n-type workfunction TiN layer.

Referring now to FIG. 5, there is illustrated the exemplary semiconductor structure of FIG. 4 after forming a gate dielectric material layer 24 and an n-type workfunction TiN layer 26. In the present application, the gate dielectric material layer 24 is formed on exposed surfaces of the bottom spacer 22, and the semiconductor fins 10F and the hard mask caps 14 that are present in both device regions (100/102). The n-type workfunction TiN layer 26 is formed on the gate dielectric material layer 24. The n-type workfunction TiN layer 26 may be referred to as a metal gate layer.

The gate dielectric material layer 24 may be composed of a gate dielectric material such as, for example, an oxide, nitride, and/or oxynitride. In one example, the gate dielectric material layer 24 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric material layer 24. The gate dielectric material that provides the gate dielectric material layer 24 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material that provides the gate dielectric material layer 24 can have a thickness in a range from 1 nm to 10 nm. Other thicknesses that are lesser than, or greater than, the afore- mentioned thickness range can also be employed for the gate dielectric material that provides the gate dielectric material layer 24.

The n-type workfunction TiN layer 26 that is formed at this point of the present application has a first workfunction value which is typically in a range from 4.3 eV to 4.6 eV. In accordance with the present application, the n-type workfunction TiN layer 26 has a first threshold voltage.

The n-type workfunction TiN layer 26 can be formed by a depositing a TiN layer and thereafter annealing the TiN layer. The depositing may include chemical vapor deposition (CVD), plasma enhanced chemical vapor deposition (PECVD) or atomic layer deposition (ALD). The anneal used to provide the n-type workfunction TiN layer 26 may be a furnace anneal or a laser anneal. The anneal may be performed at a temperature from 800° C. to 1100° C. and in an inert ambient such as, for example, helium, argon and/or neon.

In one embodiment of the present application, the n-type workfunction TiN layer 26 can have a thickness in a range from 5 nm to 20 nm. Other thicknesses that are lesser than, or greater than, the aforementioned thickness range can also be employed for the gate dielectric material that provides the n-type workfunction TiN layer 26.

Figure 6:
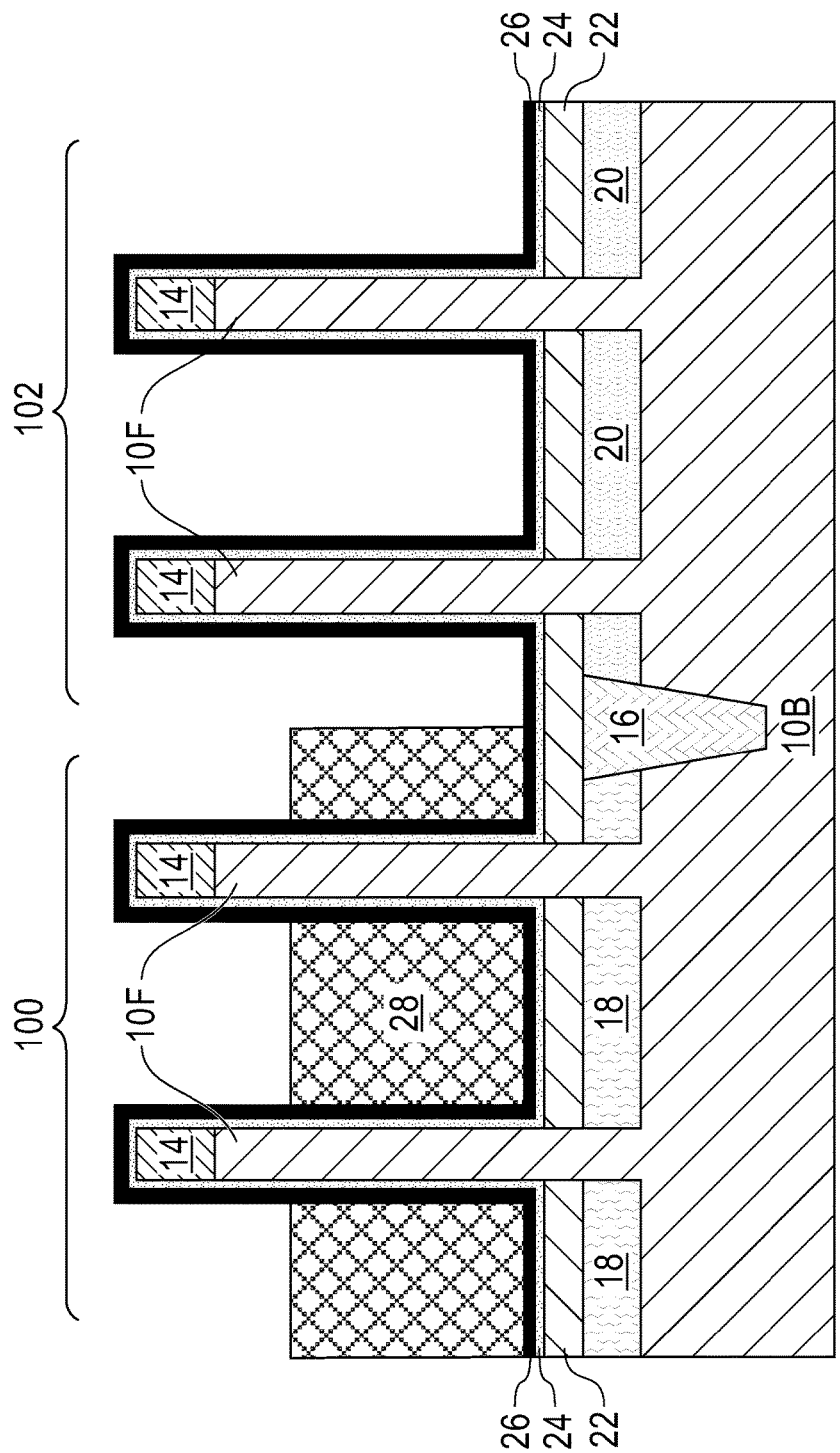
FIG. 6 is a cross sectional view of the exemplary semiconductor structure of FIG. 5 after forming a block mask in the nFET device region.

Referring now to FIG. 6, there is illustrated the exemplary semiconductor structure of FIG. 5 after forming a block mask 28 in the nFET device region 100. Block mask 28 is designed to protect a lower portion of the n-type workfunction TiN layer 26 in the nFET device region 100, while leaving an upper portion of the n-type workfunction TiN layer 26 in the nFET device region 100 physically exposed. The block mask 28 also leaves the entirety of the n-type workfunction TiN layer 26 in the pFET device region 102 physically exposed.

Block mask 28 may be composed of any block mask material such as, for example, an organic planarization material. The organic planarization material can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the organic planarization material can include a transparent organic polymer. The organic planarization material can be a standard $C_xH_y$ polymer.

Block mask 28 may be formed by deposition of the block mask material and then patterning the deposited block mask material. The patterning of the block mask material may be performed by lithography and etching. In some embodiments, and following the patterning process, the patterned block mask may be recessed to provide block mask 28.

Figure 7:
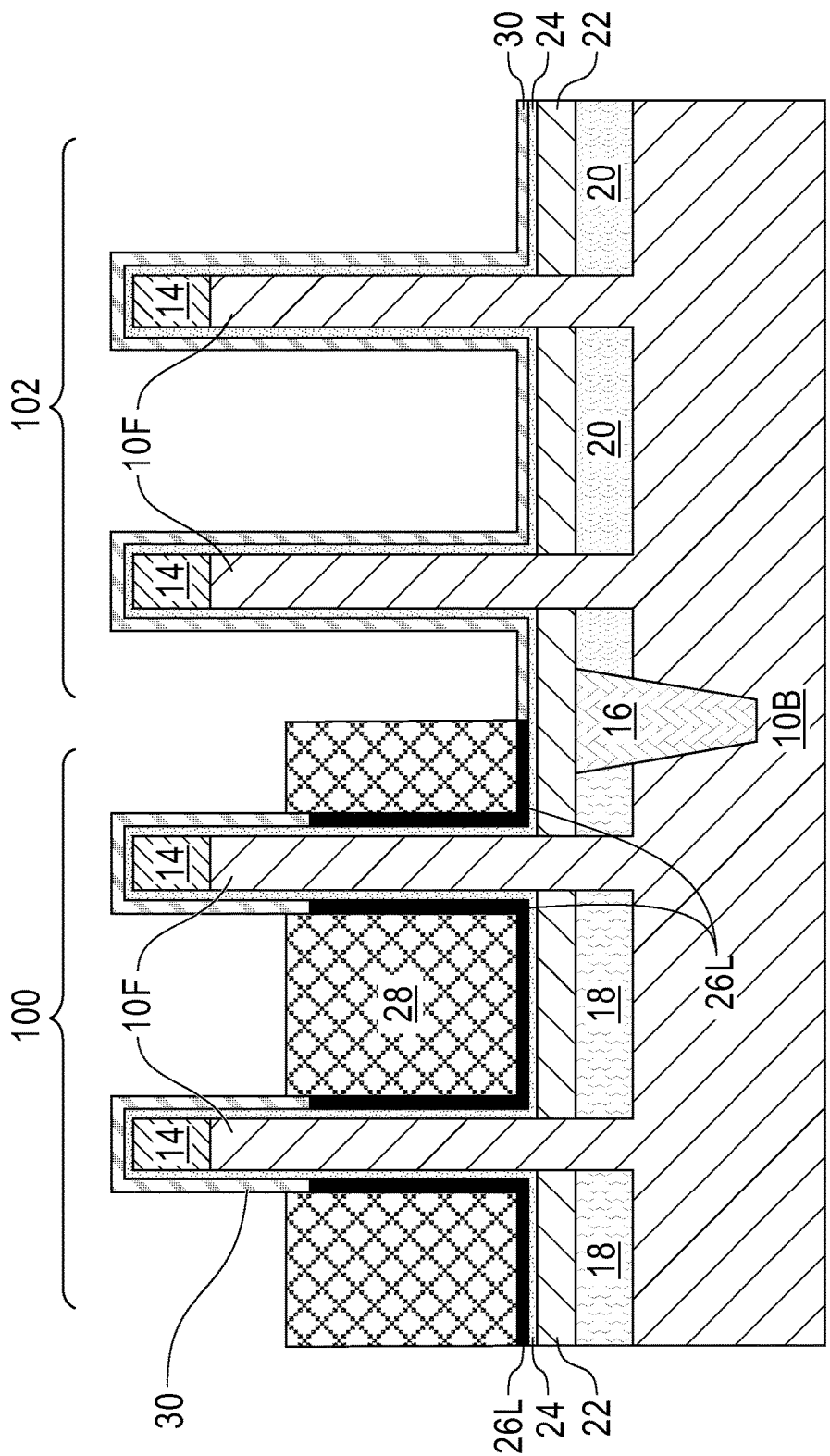
FIG. 7 is a cross sectional view of the exemplary semiconductor structure of FIG. 6 after performing a first metal gate treatment on the physically exposed portions of the n-type workfunction TiN layer in the nFET device region and the pFET device region to provide a first modified TiN layer in both device regions.

Referring now to FIG. 7, there is illustrated the exemplary semiconductor structure of FIG. 6 after performing a first metal gate treatment on the physically exposed portions of the n-type workfunction TiN layer 26 in the nFET device region 100 and the pFET device region 102 to provide a first modified TiN layer 30 in both device regions (100/102). The first modified TiN layer 30 has a second workfunction value that is higher than the first workfunction value. In one embodiment, the second workfunction value of the first modified TiN layer 30 is from 4.6 eV to 4.9 eV. In accordance with the present application, the first modified TiN layer 30 has a second threshold voltage that is higher, i.e., greater, than the first threshold voltage.

The first metal gate treatment includes introducing a threshold voltage modifying dopant such as, for example, fluorine or oxygen into the physically exposed portions of the n-type workfunction TiN layer 26 in the nFET device region 100 and the pFET device region 102. The threshold voltage modifying dopant may be introduced into the physically exposed portions of the n-type workfunction TiN layer 26 in the nFET device region 100 and the pFET device region 102 utilizing a gas phase dopant process. The block mask 28 prevents introduction of the threshold voltage modifying dopant into portions of the n-type workfunction TiN layer 26 that are covered/protected by the block mask 28. The remaining n-type workfunction TiN layer 26 that is located beneath the block mask 28 may be referred to as an n-type workfunction TiN liner 26L.

In some embodiments, the concentration of threshold voltage modifying dopant that is present in the first modified TiN layer 30 can be from 1.5E20 atoms/cm$^3$ to 8E21 atoms/cm$^3$. Other concentrations of threshold voltage modifying dopant besides the range mentioned herein can be present in the first modified TiN layer 30 so as long as the concentration of the threshold voltage modifying dopant that is present in the first modified TiN layer 30 provides the desired threshold voltage change in both device regions.

Figure 8:
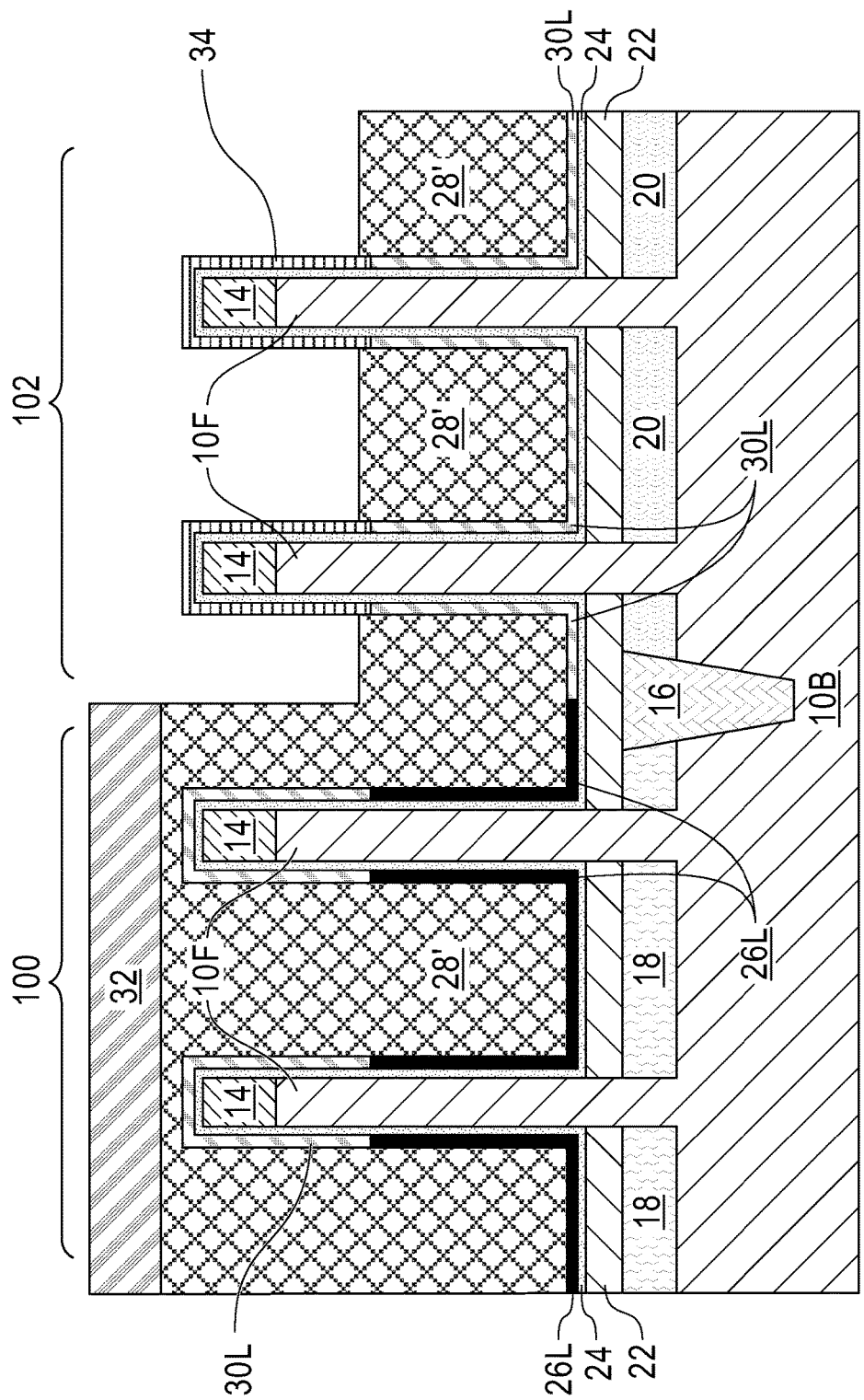
FIG. 8 is a cross sectional view of the exemplary semiconductor structure of FIG. 7 after forming additional block mask material, patterning the additional block mask material to provide a second block mask and performing a second metal gate treatment on the physically exposed first modified TiN layer in the pFET device region so as to provide a second modified TiN layer.

Referring now to FIG. 8, there is illustrated the exemplary semiconductor structure of FIG. 7 after forming additional block mask material, patterning the additional block mask material to provide a second block mask 28', and performing a second metal gate treatment on the physically exposed first modified TiN layer 30 in the pFET device region 102 so as to provide a second modified TiN layer 34.

The forming of the additional block mask includes depositing additional block mask material in both device regions (100/102). The additional block mask material may include one of the block mask materials mentioned above for block mask 28. In some embodiments, a hard mask material can be formed on the additional block mask material prior to patterning and during the patterning process, hard mask 32 is formed. The hard mask material that provides hard mask 32 may include one of the hard mask materials mentioned above for the hard mask layer 14L. The hard mask material that provides the hard mask 32 can be formed utilizing one of the deposited processes mentioned above for forming hard mask layer 14L. The hard mask 32 may have a thickness from 50 nm to 100 nm.

The patterning of the additional block mask material and, if present, the hard mask material, may include lithography and etching. The resultant second block mask 28' that is formed is present in the nFET device region 100 as well as the pFET device region 102. In the nFET device region 100, the entirety of the first modified TiN layer 30 is covered. In the pFET device region 102, the second block mask 28' protects only a lower portion of the first modified TiN layer 30. An upper portion of the first modified TiN layer 30 in the pFET device region 102 is physically exposed.

The second modified TiN layer 30 that is formed has a third workfunction value that is lower than the second workfunction value. In one embodiment, the third workfunction value of the second modified TiN layer 34 is from 4.4 eV to 4.7 eV. In accordance with the present application, the second modified TiN layer 34 has a threshold voltage that is higher, i.e., greater, than the second threshold voltage and the first threshold voltage.

The second metal gate treatment includes introducing a threshold voltage modifying dopant such as, for example, fluorine or oxygen into the physically exposed portions of the first modified TiN layer 30 in the pFET device region 102. The threshold voltage modifying dopant may be introduced into the physically exposed portions of the first modified TiN layer 30 in the pFET device region 102 utilizing a gas phase dopant process. The second block mask 28' prevents any modification of the n-type workfunction TiN liner 26L or the first modified TiN layer 30 in the nFET device region. The second block mask 28' also prevents any modification of the protected/covered first modified TiN layer 30 in the pFET device region 102. The remaining first modified TiN layer 30 in the pFET device region 102 may be referred to as a first modified TiN liner 30L.

In some embodiments, the concentration of threshold voltage modifying dopant that is present in the second modified TiN layer 34 can be from 1E20 atoms/cm$^3$ to 8E21 atoms/cm$^3$. Other concentrations of threshold voltage modifying dopant besides the range mentioned herein can be present in the second modified TiN layer 34 so as long as the concentration of the threshold voltage modifying dopant that is present in the second modified TiN layer 34 provides the desired threshold voltage change in the pFET device region.

Figure 9:
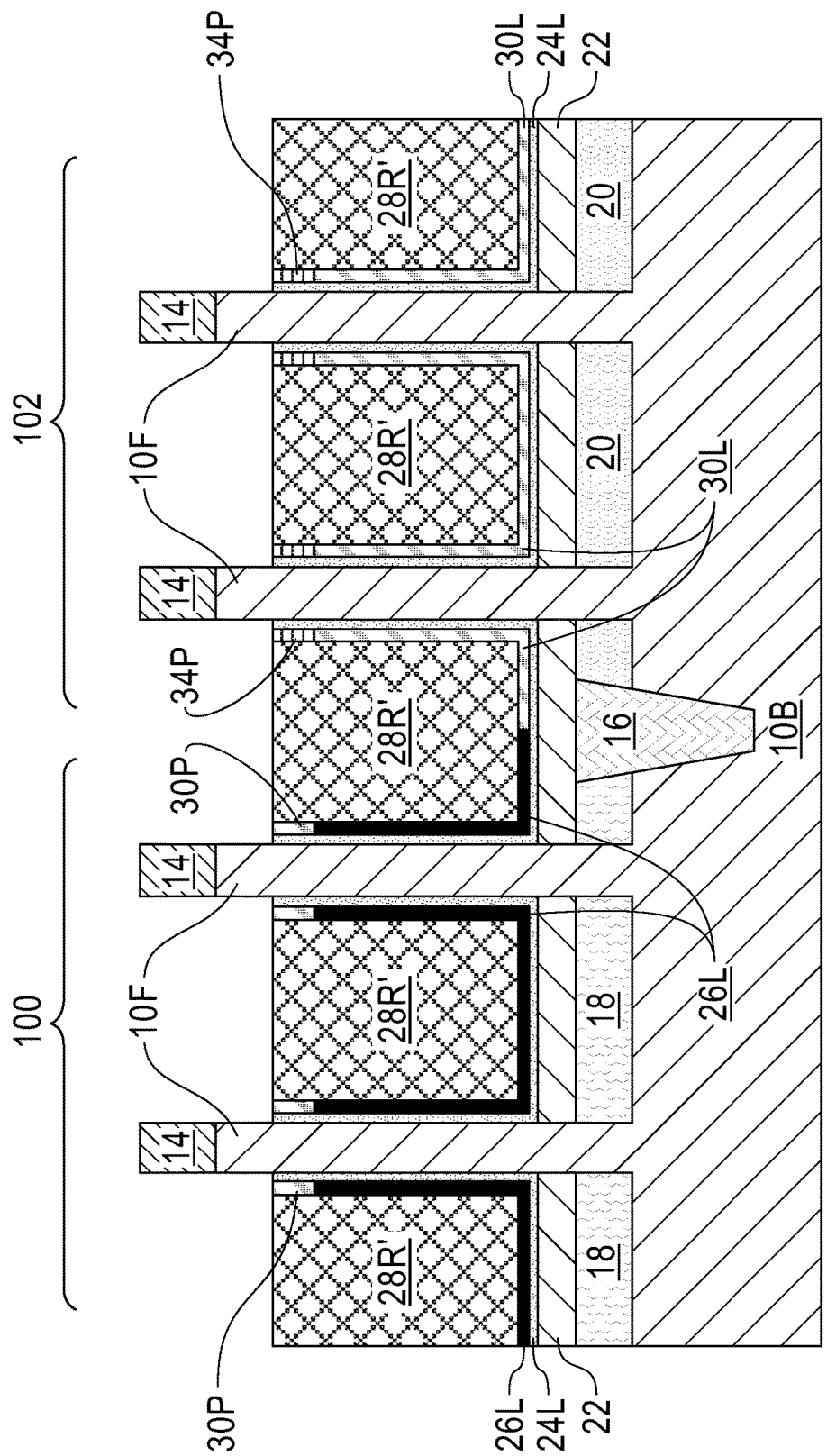
FIG. 9 is a cross sectional view of the exemplary semiconductor structure of FIG. 8 after recessing the second block mask, removing physically exposed portions of the first modified TiN layer in the nFET device region and physically exposed portions of the second modified TiN layer in the pFET device region, and removing the gate dielectric material layer that is located beneath the physically exposed portions of the first modified TiN layer and the physically exposed portions of the second modified TiN layer.

Referring now to FIG. 9, there is illustrated the exemplary semiconductor structure of FIG. 8 after recessing the second block mask 28', removing physically exposed portions of the first modified TiN layer 30 in the nFET device region 100 and the second modified TiN layer 34 in the pFET device region 102, and removing the gate dielectric material layer 24 that is located beneath the physically exposed portions of the first modified TiN layer 30 and the physically exposed portions of the second modified TiN layer 34.

In some embodiments, and prior to recessing the second block mask 28', the hard mask 32 is removed utilizing a material removal process such as, for example, planarization or etching.

The second block mask 28' may be recessed utilizing a recess etching process that is selective in removing the block mask material. The remaining second block mask 28' after recessing may be referred to as a recessed block mask 28R. The recessed block mask 28R physically exposes a portion of the first modified TiN layer 30 in the nFET device region 100, and a portion of the second modified TiN layer 34 in the pFET device region 102.

The physically exposed portion of the first modified TiN layer 30 in the nFET device region 100, and physically exposed portion of the second modified TiN layer 34 in the pFET device region 102 are removed utilizing an etching process that is selective in removing TiN. A portions of the first modified TiN layer 30 remains in the nFET device region 100, and a portion of the second modified TiN layer 34 remains in the pFET device 102. The remaining portion of the first modified TiN layer 30 is referred herein as a first modified TiN portion 30P, while the remaining portion of the second modified TiN layer 34 is referred to herein as a second modified TiN portion 34P.

The gate dielectric material layer 24 that is located beneath the physically exposed portions of the first modified TiN layer 30 and the physically exposed portions of the second modified TiN layer 34 may be removed utilizing an etching process that is selective in removing the gate dielectric material. The remaining gate dielectric material layer 24 may be referred to herein as a gate dielectric layer 24L. In some embodiments, a single etch may be used to remove the physically exposed portions of the modified TiN and underlying gate dielectric material layer in both device regions (100/102).

As is shown in FIG. 9, the removal of the physically exposed portions of the modified TiN and underlying gate dielectric material layer in both device regions (100/102) physically exposes the hard mask caps 14 and an upper portion of each semiconductor fin 10F in both device regions (100/102).

Figure 10:
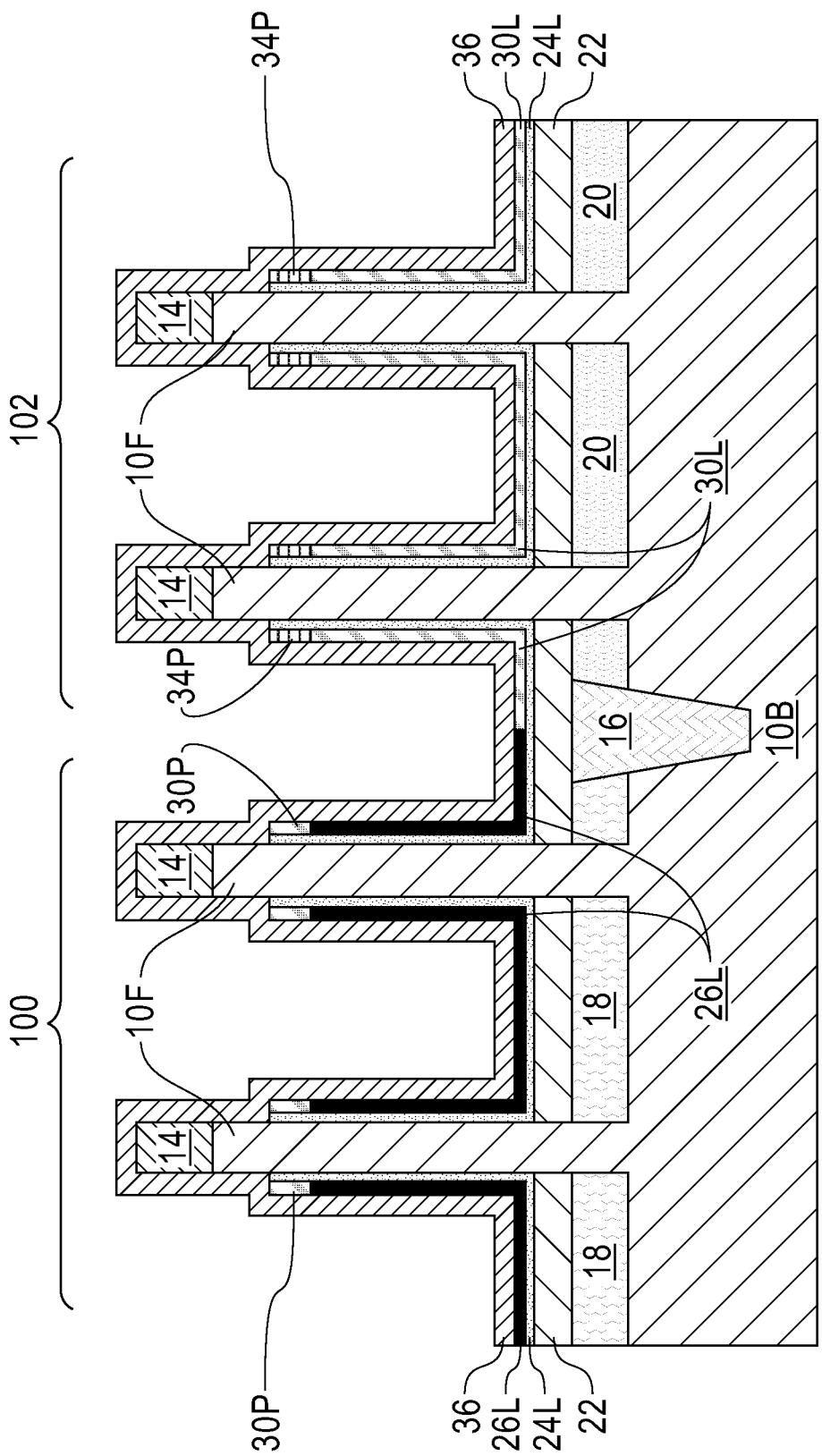
FIG. 10 is a cross sectional view of the exemplary semiconductor structure of FIG. 9 after removing the recessed second block mask and forming a gate encapsulation layer.

Referring now to FIG. 10, there is illustrated the exemplary semiconductor structure of FIG. 9 after removing the recessed block mask 28R and subsequent formation of a gate encapsulation layer 36. The removal of the recessed block mask 28R may be performed utilizing an etching process that is selective in removing block mask material.

The gate encapsulation layer 36 is then formed. The gate encapsulation layer 36 includes a hard mask material that may be the same as, or different from, the hard mask material that provides the hard mask caps 14. In one example, the gate encapsulation layer 36 may be composed of silicon nitride. The gate encapsulation layer 36 may be formed by a deposition process such as, for example, chemical vapor deposition (CVD) or plasma enhanced chemical vapor deposition (PECVD). The gate encapsulation layer 36 may have a thickness from 10 nm to 50 nm; although other thicknesses are possible and are not excluded from being used.

Figure 11:
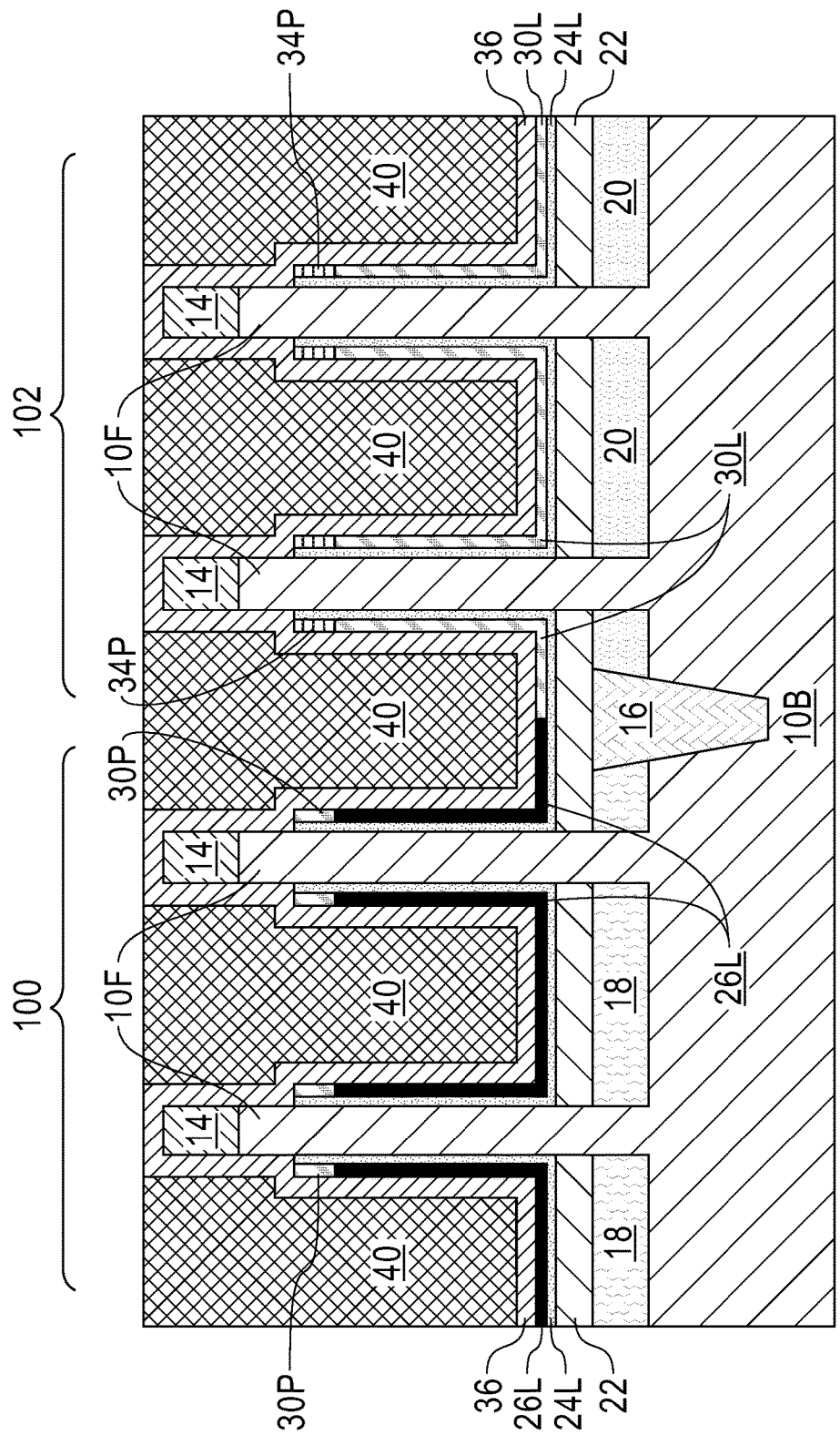
FIG. 11 is a cross sectional view of the exemplary semiconductor structure of FIG. 10 after forming a middle-of-the-line (MOL) dielectric material.

Referring now to FIG. 11, there is illustrated the exemplary semiconductor structure of FIG. 10 after formation of a middle-of-the-line (MOL) dielectric material 40. The MOL dielectric material 40 is formed on the gate encapsulation layer 36 and laterally surrounds each of the semiconductor fins 10F. At this point of the present application, the MOL dielectric material 40 has a topmost surface that is coplanar with a topmost surface of the gate encapsulation layer 36.

The MOL dielectric material 40 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 40. The use of a self-planarizing dielectric material as the MOL dielectric material 40 may avoid the need to perform a subsequent planarizing step.

In one embodiment, the MOL dielectric material 40 can be formed utilizing a deposition process including, for example, chemical vapor deposition (CVD), plasma enhanced chemical vapor deposition (PECVD), evaporation or spin-on coating. In some embodiments, a planarization process and/or an etch back process follows the deposition of the MOL dielectric material 40.

Figure 12:
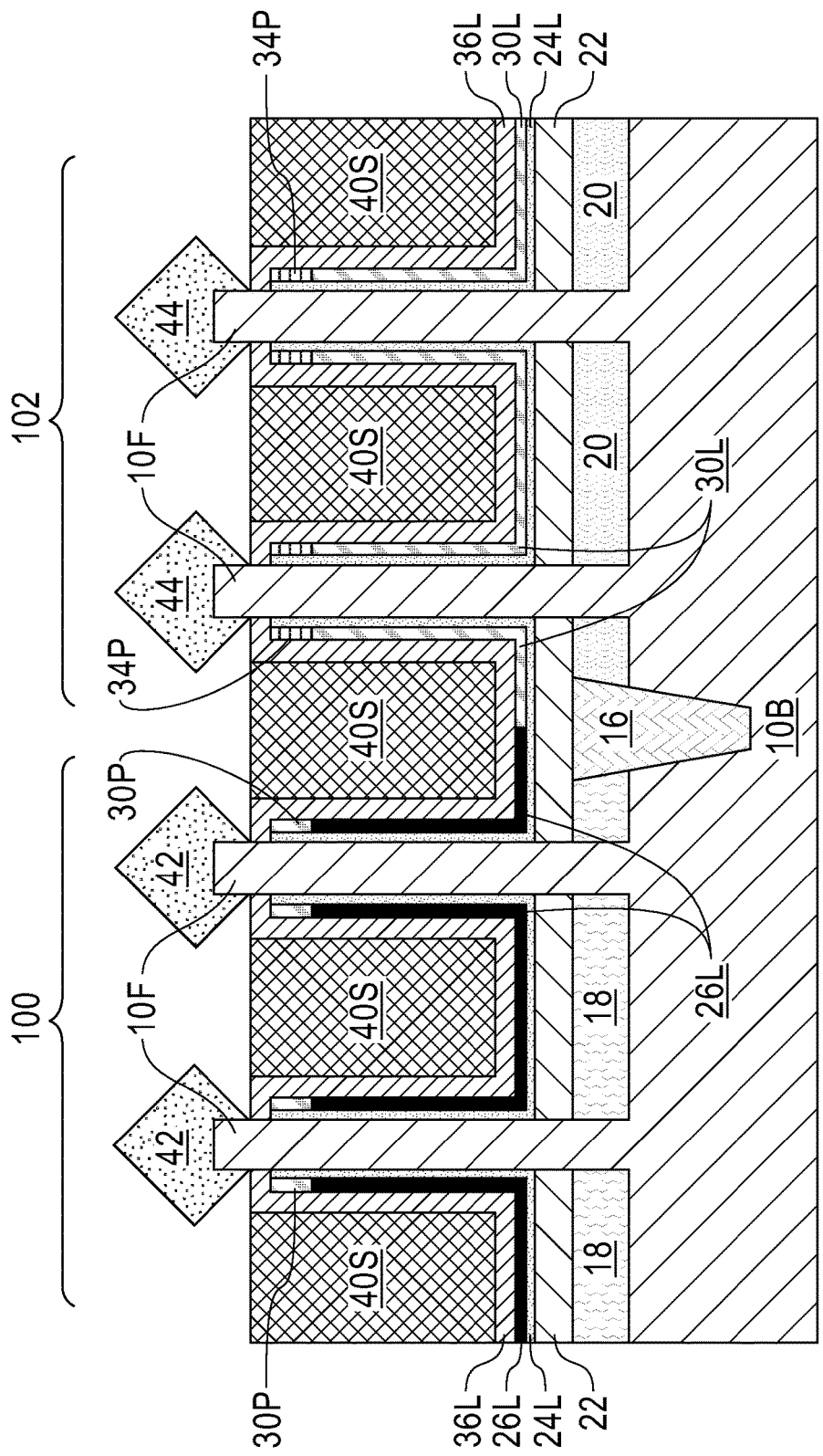
FIG. 12 is a cross sectional view the exemplary semiconductor structure of FIG. 11 after physically exposing an uppermost portion of each semiconductor fin in the nFET device region and the pFET device region, and forming a top n-doped source/drain structure on the physically exposed surfaces of the semiconductor fins in the nFET device region and a top p-doped source/drain structure on the physically exposed surfaces the semiconductor fins in the pFET device region.

Referring now to FIG. 12, there is illustrated he exemplary semiconductor structure of FIG. 11 after exposing an uppermost portion of each semiconductor fin 10F in the nFET device region 100 and the pFET device region 100, and forming a top n-doped source/drain structure 42 on the exposed surfaces of the semiconductor fins 10F in the nFET device region 100 and a top p-doped source/drain structure 44 on the exposed surfaces the semiconductor fins 10F in the pFET device region 102.

The exposing the uppermost portion of each semiconductor fin 10F in the nFET device region 100 and the pFET device region 100 includes first recessing an upper portion of the MOL dielectric material 40 utilizing a recess etching process. The remaining recessed MOL dielectric material 40 may be referred to herein as a MOL dielectric structure 40S. The height of the MOL structure 40S should be higher than a topmost surface of the modified TiN portions (30P, 34P) in each of the device regions (100,102). The physically exposed portion of the gate encapsulation layer is then removed utilizing a selective etch to provide a gate encapsulation liner 36L.

The gate encapsulation liner 36L is present on a sidewall surface and a topmost surface of the first modified TiN portion 30P and the n-workfunction TiN liner 26L in the nFET device region 100, while the gate encapsulation liner 36L is present on a sidewall surface and a topmost surface of the second modified TiN portion 34P and the first modified TiN liner 30L in the pFET device region 102. Collectively, the first modified TiN portion 30P and the n-workfunction TiN liner 26L may be referred to herein as an nFET gate structure having a gradient threshold voltage (low to high), while the second modified TiN portion 34P and the first modified TiN liner 30L in the pFET device region 102 may be referred to herein as a pFET gate structure having a gradient threshold voltage (low to high).

Each hard mask 14 is then removed utilizing a material removal process such as, for example, etching or planarization. In some embodiments, and when the gate encapsulation layer 36 and the hard masks 14 are composed of a same hard mask material, a portion of the hard masks 14 may be removed during the etching of the gate encapsulation layer 36. At this point of the present application, an upper portion (sidewalls and a topmost surface) of each semiconductor fin 10F is physically exposed.

The top n-doped source/drain structure 42 and the top p-doped source/drain structure 44, which can be formed utilizing an epitaxial growth (or deposition) process, as defined above, can be formed in any order. For example, and in one embodiment, the top n-doped source/drain structure 42 can be formed prior to the top p-doped source/drain structure 44. In such an embodiment, a block mask is formed in the pFET device region 102 and then the top n-doped source/drain structure 42 is formed by epitaxial growth. Following the epitaxial growth of the top n-doped source/drain structure 42, the block mask is removed from the pFET device region 102, another block mask is formed in the nFET device region 100 that now includes the top n-doped source/drain structure 42, and thereafter the top p-doped source/drain structure 44 is formed by epitaxial growth. Following epitaxial growth of the top p-doped source/drain structure 44, the another block mask is removed from the nFET device region 100. In embodiments, in which the top p-doped source/drain structure 44 is formed prior to the top n-doped source/drain structure 42, the order of the above mentioned processing steps is reversed.

In accordance with the present application, the top n-doped source/drain structure 42 and the top p-doped source/drain structure 44 are used as a source region of the vertical transport FETs.

The top n-doped source/drain structure 42 includes a semiconductor material and an n-type dopant. The semiconductor material that provides the top nFET source/drain structure 42 may be the same or different from the semiconductor material of semiconductor substrate 10. The concentration of n-type dopant within the semiconductor material that provides the top n-doped source/drain structure 42 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top n-doped source/drain structure 42 may be grown on exposed sidewalls and a topmost surface of each semiconductor fin 10F in the nFET device region 100. The top n-doped source/drain structure 42 may have a faceted surface. In one example, the top n-doped source/drain structure 42 may be diamond shaped.

The top p-doped source/drain structure 44 includes a semiconductor material and a p-type dopant. The semiconductor material that provides the top pFET source/drain structure 44 may be the same or different from the semiconductor material of semiconductor substrate 10. Also, the semiconductor material that provides the top p-doped source/drain structure 44 may be the same as, or different from, the semiconductor material that provides the top p-doped source/drain structure 42. The concentration of p-type dopant within the semiconductor material that provides the top p-doped source/drain structure 44 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top p-doped source/drain structure 44 may be grown on exposed sidewalls and a topmost surface of each semiconductor fin 10F in the pFET device region 102. The top p-doped source/drain structure 44 may have a faceted surface. In one example, the top p-doped source/drain structure 44 may be diamond shaped.

FIG. 12 illustrates an exemplary structure including a vertical transport nFET and a laterally adjacent, but spaced apart, vertical transport pFET. The vertical transport nFET includes at least one semiconductor fin 10F present in an nFET device region 100 and extending upwards from a surface of a base semiconductor substrate 10B. A bottom n-doped source/drain structure 18 is located on the base semiconductor substrate 10B and contacts sidewall surfaces of a lower portion of the at least one semiconductor fin 10F, wherein the bottom n-doped source/drain structure serves as a drain region. A gate dielectric layer 24L is located above the bottom n-doped source/drain structure 18 and contacts another portion of the sidewall surfaces of the at least one semiconductor fin 10F. An nFET gate structure (26L, 30P) is located laterally adjacent a sidewall of the gate dielectric layer 24L, the nFET gate structure (26L, 30P) comprises a TiN liner 26L having a first threshold voltage and a TiN portion 30P having a second threshold voltage that is greater than the first threshold voltage. As is shown, a bottommost surface of TiN portion 30P directly contacts a topmost surface of TiN liner 26L. A top n-doped source/drain structure 42 is located on an upper portion of the at least one semiconductor fin 10F and serves a source region.

The vertical transport pFET includes at least one semiconductor fin 10F present in a pFET device region 102 and extending upwards from the surface of the base semiconductor substrate 10B. A bottom p-doped source/drain structure 20 is located on the base semiconductor substrate 10B and contacts sidewall surfaces of a lower portion of the at least one semiconductor fin 10F, wherein the bottom p-doped source/drain structure serves as a drain region. A gate dielectric layer 24L is located above the bottom p-doped source/drain structure 20 and contacts another portion of the sidewall surfaces of the at least one semiconductor fin 10F. A pFET gate structure (30L, 34P) is located laterally adjacent a sidewall of the gate dielectric layer 24L, the pFET gate structure (30L, 34P) comprises a TiN liner 30L having the second threshold voltage and a TiN portion 34P having a third threshold voltage that is greater than the second threshold voltage. As is shown, a bottommost surface of TiN portion 34P directly contacts a topmost surface of TiN liner 30L. A top p-doped source/drain structure 44 is located on an upper portion of the at least one semiconductor fin 10F and serves as a source region.

Figure 13:
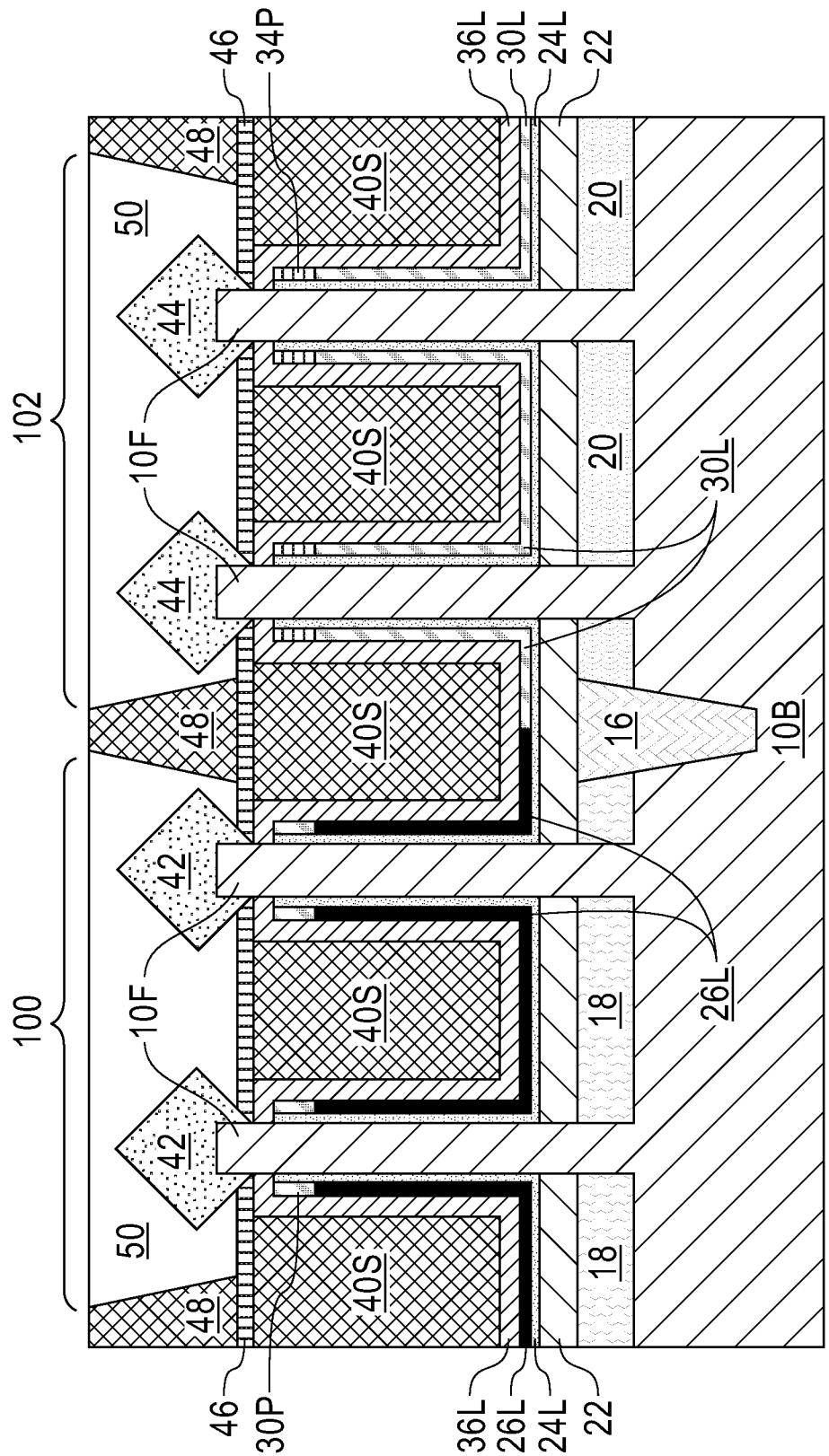
FIG. 13 is a cross sectional view of the exemplary semiconductor structure of FIG. 12 after forming a top spacer and top source/drain contact structures.

Referring now to FIG. 13, there is illustrated the exemplary semiconductor structure of FIG. 12 after forming a top spacer 46 and top source/drain contact structures 50. The top spacer 46 is formed on the physically exposed topmost surface of the MOL dielectric structure 40S and on the physically exposed topmost surface of the gate encapsulation liner 36L.

The top spacer 46 may be composed of any dielectric spacer material including for example, silicon dioxide, silicon nitride or silicon oxynitride. The top spacer 46 may be composed of a same, or different, dielectric spacer material than the bottom spacer 22. The top spacer 46 may be formed utilizing a deposition process such as, for example, chemical vapor deposition or plasma enhanced chemical vapor deposition. In some instances, an etch may follow the deposition of the dielectric spacer material that provides the top spacer 46. The top spacer 46 may have a thickness from 4 nm to 10 nm. Other thicknesses that are lesser than, or greater than, the aforementioned thickness range may also be employed in the present application as the thickness of the top spacer 46.

After top spacer 46 formation, an interlayer dielectric (ILD) material 48 is formed. The ILD material 48 may include one of the dielectric materials mentioned above for the MOL dielectric material 40. The ILD material 48 may include a same, or different dielectric material, than the MOL dielectric material 40. The ILD material 48 may be formed by one of the deposition processes mentioned above in forming the MOL dielectric material 40. A planarization process may follow the deposition of the dielectric material that provides the ILD material 48.

Contact openings (not specifically shown) are then formed into the ILD material to physically exposed surfaces of the top n-doped source/drain structure 42 and the top p-doped source/drain structure 44. A contact metal such as, for example, copper, aluminum, tungsten, cobalt, or alloys thereof is the formed into each contact opening utilizing a deposition process. A planarization process may follow the deposition process. The contact metal or metal alloy within each contact opening is referred to herein as a contact structure 50. As shown in FIG. 13, the contact structures 50 have a topmost surface that is coplanar with a topmost surface of the ILD material 48.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one semiconductor fin present in a device region and extending upwards from a surface of a base semiconductor substrate;
   a bottom source/drain structure located on the base semiconductor substrate and contacting sidewall surfaces of a lower portion of the at least one semiconductor fin, wherein the bottom source/drain structure serves as a drain region;
   a gate dielectric layer located above the bottom source/drain structure and contacting another portion of the sidewall surfaces of the at least one semiconductor fin;
   a gate structure located laterally adjacent a sidewall of the gate dielectric layer, the gate structure comprising a TiN liner having a first threshold voltage and a TiN portion having a second threshold voltage that is greater than the first threshold voltage; and a top source/drain structure located on an upper portion of the at least one semiconductor fin, wherein the top source/drain structure serves as a source region.

2. The semiconductor structure of claim 1, wherein the device region is an nFET device region, the TiN liner comprises n-type workfunction TiN, and the TiN portion comprises n-type workfunction TiN containing a threshold voltage modifying dopant.

3. The semiconductor structure of claim 1, wherein the device region is a pFET device region, the TiN liner comprises a first threshold voltage modified TiN material containing a threshold voltage modifying dopant, and a second threshold voltage modified TiN material containing a threshold voltage modifying dopant.

4. The semiconductor structure of claim 1, further comprising a gate encapsulation liner located on the gate structure.

5. The semiconductor structure of claim 4, further comprising a MOL dielectric structure located adjacent the gate encapsulation liner.

6. The semiconductor structure of claim 5, further comprising a bottom spacer located between the bottom source/drain structure and the gate dielectric layer.

7. The semiconductor structure of claim 6, further comprising a top spacer located on the MOL dielectric structure.

8. The semiconductor structure of claim 1, further comprising a contact structure contacting surfaces of the top source/drain structure.

* * * * *